(12) United States Patent
Huang et al.

(10) Patent No.: US 9,953,877 B2
(45) Date of Patent: Apr. 24, 2018

(54) BACKSIDE PROCESSED SEMICONDUCTOR DEVICE

(71) Applicant: SEMICONDUCTOR MANUFACTURING INTERNATIONAL (SHANGHAI) CORPORATION, Shanghai (CN)

(72) Inventors: Herb He Huang, Shanghai (CN); Haiting Li, Shanghai (CN); Jiguang Zhu, Shanghai (CN); Clifford Ian Drowley, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/996,091

(22) Filed: Jan. 14, 2016

(65) Prior Publication Data
    US 2016/0204035 A1    Jul. 14, 2016

(30) Foreign Application Priority Data

Jan. 14, 2015    (CN) .......................... 2015 1 0018692

(51) Int. Cl.
| H01L 21/8234 | (2006.01) |
| H01L 21/306 | (2006.01) |
| H01L 21/304 | (2006.01) |
| H01L 21/265 | (2006.01) |
| H01L 21/683 | (2006.01) |
| H01L 21/762 | (2006.01) |
| H01L 23/48 | (2006.01) |

(Continued)

(52) U.S. Cl.
CPC .............. *H01L 21/823481* (2013.01); *H01L 21/26506* (2013.01); *H01L 21/304* (2013.01); *H01L 21/3046* (2013.01); *H01L 21/30604* (2013.01); *H01L 21/30608* (2013.01); *H01L 21/30625* (2013.01); *H01L 21/6835* (2013.01); *H01L 21/76224* (2013.01); *H01L 23/481* (2013.01); *H01L 29/0649* (2013.01); *H01L 27/088* (2013.01); *H01L 2221/6834* (2013.01); *H01L 2221/68327* (2013.01); *H01L 2924/0002* (2013.01)

(58) Field of Classification Search
None
See application file for complete search history.

(56) References Cited

U.S. PATENT DOCUMENTS 6,600,170 B1 * 7/2003 Xiang ............. H01L 21/823807
                                              257/18
8,574,929 B1 * 11/2013 Or-Bach ............. H01L 27/0688
                                              257/E21.568

(Continued)

*Primary Examiner* — Erik Kielin
(74) *Attorney, Agent, or Firm* — Kilpatrick Townsend & Stockton LLP

(57) ABSTRACT

A method of forming a semiconductor device includes: providing a first substrate, forming at least one transistor on a first surface of the first substrate; forming a first dielectric cap layer covering the first surface of the first substrate; forming a first interconnect structure on the first dielectric cap layer; providing a carrier substrate; bonding the carrier substrate to the first substrate through the first dielectric cap layer; and from a second surface of the first substrate opposite to the first surface, thinning the first substrate to a second depth.

15 Claims, 4 Drawing Sheets

(51) Int. Cl.
*H01L 29/06* (2006.01)
*H01L 27/088* (2006.01)

(56) References Cited

U.S. PATENT DOCUMENTS

| | | | | |
|---|---|---|---|---|
| 2006/0022264 A1* | 2/2006 | Mathew | ............ | H01L 29/66553 |
| | | | | 257/331 |
| 2006/0027881 A1* | 2/2006 | Ilicali | ................ | H01L 29/66484 |
| | | | | 257/401 |
| 2006/0118935 A1* | 6/2006 | Kamiyama | ....... | H01L 21/30608 |
| | | | | 257/684 |
| 2009/0146325 A1* | 6/2009 | Liu | ....................... | H01L 23/544 |
| | | | | 257/797 |
| 2012/0248544 A1* | 10/2012 | Yokoyama | .............. | H01L 21/84 |
| | | | | 257/369 |
| 2013/0302950 A1* | 11/2013 | Doris | ................ | H01L 29/66477 |
| | | | | 438/151 |
| 2014/0094030 A1* | 4/2014 | Shimotsusa | ........... | H01L 21/768 |
| | | | | 438/652 |
| 2014/0332749 A1* | 11/2014 | Yokoyama | ...... | H01L 21/823431 |
| | | | | 257/4 |

* cited by examiner

BACKSIDE PROCESSED SEMICONDUCTOR DEVICE

CROSS-REFERENCES TO RELATED APPLICATIONS

This application claims priority to Chinese patent application No. 201510018692.7, filed on Jan. 14, 2015, the content of which is incorporated herein by reference in its entirety.

BACKGROUND OF THE INVENTION

The present invention relates to the field of semiconductor technology, and particularly relates to a method of forming a semiconductor device.

In the semiconductor art, usually it requires the use of thin film silicon-on-insulator (TF SOI) substrate to manufacture certain type semiconductor devices (for example, RF front-end devices and modules). However, since thin film silicon-on-insulator substrate has relatively high cost, its application in the semiconductor industry is limited.

SUMMARY OF THE INVENTION

In one aspect of the present invention, a method of forming a semiconductor device is provided. The method includes: providing a first substrate, and from a first surface of the first substrate, forming a shallow trench isolation in the first substrate. The shallow trench isolation has a first depth. The first depth is the distance from the bottom of the shallow trench isolation to the first surface of the first substrate. The method further includes: forming at least one transistor on the first surface of the first substrate; forming a first dielectric cap layer covering the first surface of the first substrate; forming a first interconnect structure on the first dielectric cap layer; providing a carrier substrate; and bonding the carrier substrate to the first substrate through the first dielectric cap layer. The method further includes: from a second surface of the first substrate opposite to the first surface, thinning the first substrate to a second depth. The second depth is the distance from the second surface to the first surface of the first substrate after the thinning. The method further includes: forming a second dielectric cap layer on the second surface of the first substrate; and forming a through silicon via (TSV). The TSV runs through the second dielectric cap layer, the shallow trench isolation, and the first dielectric cap layer, and is connected to the first interconnect structure.

According to an embodiment, the first substrate includes a doped epitaxial layer having a third depth. The third depth is the distance from the bottom of the doped epitaxial layer to the first surface of the first substrate. The third depth is greater than or equal to the first depth.

According to an embodiment, the method further includes, before forming the shallow trench isolation, performing ion implantation from the first surface of the first substrate to form a first injection doped layer having a fourth depth. The fourth depth is the distance from the bottom of the first injection doped layer to the first surface of the first substrate. The fourth depth is greater than or equal to the first depth.

According to an embodiment, the method further includes, after forming the shallow trench isolation and before forming the at least one transistor, performing ion implantation through the first surface of the first substrate to form an etch stop layer below the at least one transistor to be formed. The etch stop layer has a fifth depth from the first surface of the first substrate.

According to an embodiment, the second depth is substantially the same as the first depth.

According to an embodiment, the second depth is substantially the same as the third depth.

According to an embodiment, the second depth is substantially the same as the fourth depth.

According to an embodiment, the second depth is substantially the same as the fifth depth.

According to an embodiment, thinning the first substrate includes: performing backside grinding on the second surface of the first substrate; performing chemical mechanical polishing (CMP) on the second surface of the first substrate, stopping at a bottom of the shallow trench isolation; and performing wet etching on the second surface of the first substrate.

According to an embodiment, the method further includes, after performing backside grinding and before performing CMP, performing wet etching on the first substrate.

According to an embodiment, the transistor includes a source, a drain, and a gate. The source and the drain are disposed below the first surface of the first substrate, and the gate is disposed above the first surface of the first substrate.

According to an embodiment, the first substrate includes a bulk silicon substrate.

In another aspect of the present invention, an electronic apparatus is provided. The electronic apparatus includes a semiconductor device and an electronic component assembly coupled to the semiconductor device. The semiconductor device is formed by: providing a first substrate; from a first surface of the first substrate, forming a shallow trench isolation in the first substrate. The shallow trench isolation has a first depth from the bottom of the shallow trench isolation to the first surface of the first substrate. The semiconductor device is further formed by: forming at least one transistor on the first surface of the first substrate; forming a first dielectric cap layer covering the first surface of the first substrate; forming a first interconnect structure on the first dielectric cap layer; providing a carrier substrate; and bonding the carrier substrate to the first substrate through the first dielectric cap layer. The semiconductor device is further formed by: from a second surface of the first substrate opposite to the first surface, thinning the first substrate to a second depth. The second depth is the distance from the second surface to the first surface of the substrate after the thinning. The semiconductor device is further formed by: forming a second dielectric cap layer on the second surface of the first substrate; and forming a through silicon via (TSV). The TSV runs through the second dielectric cap layer, the shallow trench isolation, and the first dielectric cap layer, and is connected to the first interconnect structure.

DETAILED DESCRIPTION OF THE INVENTION

Figure 1A:
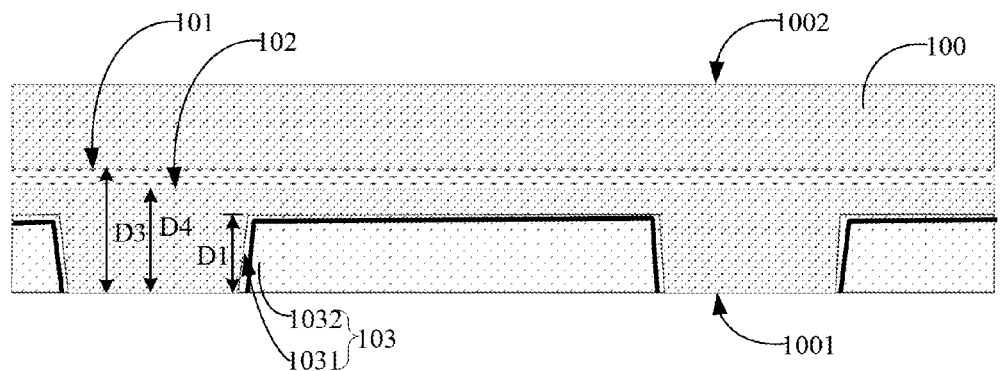
FIGS. 1A-1F are schematic cross-sectional views illustrating the intermediate steps of forming a semiconductor device according to an embodiment of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc., do not denote any order, but rather the terms first, second, etc., are used to distinguish one element from another. Furthermore, the use of the terms a, an, etc., does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

First Embodiment

In an embodiment, a method of forming a semiconductor device is provided. In the following, the method will be described with reference to FIGS. 1A-1F and 2. FIGS. 1A-1F are schematic cross-sectional views illustrating the intermediate steps of forming a semiconductor device according to an embodiment of the present invention. FIG. 2 is a simplified flowchart illustrating a method of forming a semiconductor device according to an embodiment of the present invention.

Figure 2:
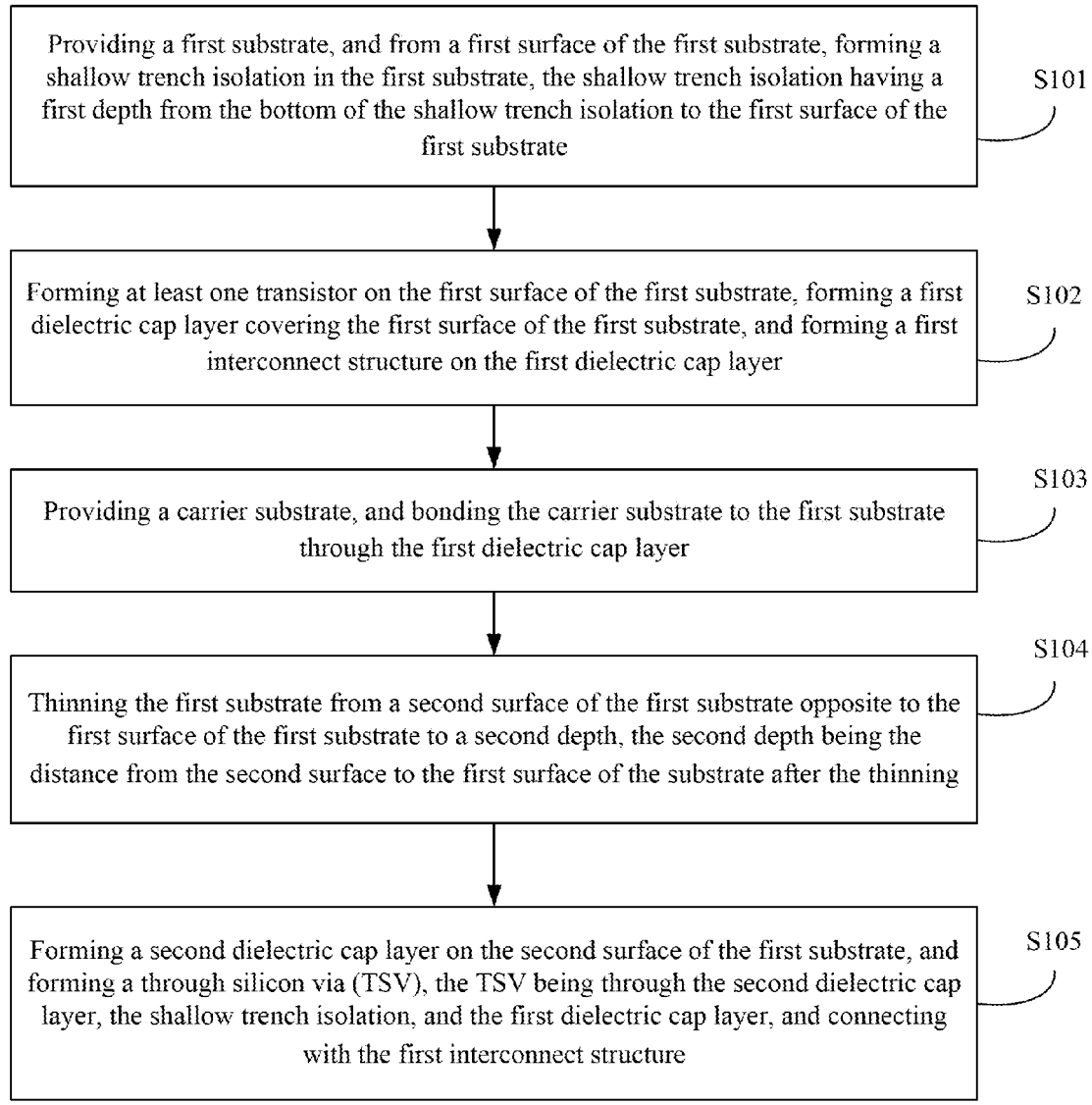
FIG. 2 is a simplified flowchart illustrating a method of forming a semiconductor device according to an embodiment of the present invention.

In an embodiment, the method includes the following steps:

With reference to FIG. 1A, step A1 includes providing a first substrate 100. The first substrate 100 includes a doped epitaxial layer 101 having a third depth D3. Step A1 further includes, from the first surface (also referred herein as the upper surface) 1001 of the first substrate 100, performing ion implantation to form a first implantation doped layer 102 having a fourth depth D4 in the first substrate 100. The first implantation doped layer 102 serves as an etch stop layer. Step A1 further includes, from the first surface 1001 of the first substrate 100, forming a shallow trench isolation (STI) 103 in the first substrate 100 having a first depth D1.

The surface of the substrate 100 opposite to the first surface 1001 is referred to herein as the second surface (also referred herein as the lower surface) 1002 of the substrate 100, as shown in FIG. 1A.

Unless particularly specified, the term "depth" (e.g., the third depth D3) refers to the distance of the corresponding part (e.g., doped epitaxial layer 101) from the first surface 1001 of the first substrate 100.

The doped epitaxial layer 101 has a doping concentration that is different from those of the other regions of the first substrate 100.

According to an embodiment, the shallow trench isolation 103 includes a pad layer 1031 and a main structure layer 1032. The pad layer 1031 can serve as a stop layer for the subsequent CMP process. In an embodiment, the material for the pad layer 1031 includes silicon oxide. The material for the main structure layer 1032 includes silicon nitride.

The first substrate 100 may be a bulk silicon substrate or another type of suitable substrate. It does not require a thin film silicon-on-insulator (TF SOI) substrate, or high-resistance substrate, as required in conventional technologies.

In an embodiment, D3 is greater than or equal to D4. D4 is greater than or equal to D1.

In an alternative embodiment, the first substrate 100 may not include the doped epitaxial layer 101 having the third depth D3. In addition, the step of performing ion implantation to form the first implantation doped layer 102 having the fourth depth D4 may be omitted.

Figure 1B:
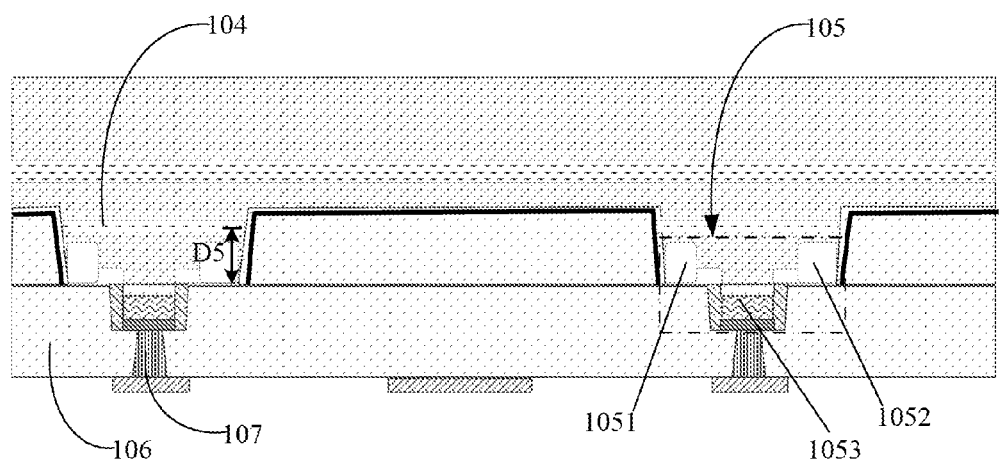

Step A2 includes forming a well region (not shown), and from the first surface 1001 of the first substrate 100, performing ion implantation to form an etch stop layer 104 having a fifth depth D5 in the lower region of the transistor 105 to be formed. Step A2 further includes forming a source 1051, a drain 1052, and a gate 1053 of the transistor 105, forming a first dielectric cap layer 106 covering the first surface 1001 of the first substrate 100, and forming a first interconnect structure 107 located within and on the surface of the first dielectric cap layer 106, as shown in FIG. 1B.

In an embodiment, the fifth depth D5 is less than the first depth D1. The first interconnect structure 107 is connected to at least one of the source 1051, the drain 1052, or the gate 1053. The gate 1053 may be formed by using a gate-first or gate-last process.

There is at least one transistor 105. In an embodiment, the source 1051 and the drain 1052 are located below the first surface 1001, and the gate 1053 is located above the first surface 1001.

While the transistor 105 is being formed, other devices, such as diodes, resistors, capacitors, etc., may also be formed.

According to an embodiment of the present invention, the transistor and other devices are directly formed on the bulk silicon substrate rather than thin film silicon-on-insulator (TF SOI) substrate. The processes of forming the transistor and other devices are the same as those for forming CMOS devices on a bulk silicon substrate.

Figure 1C:
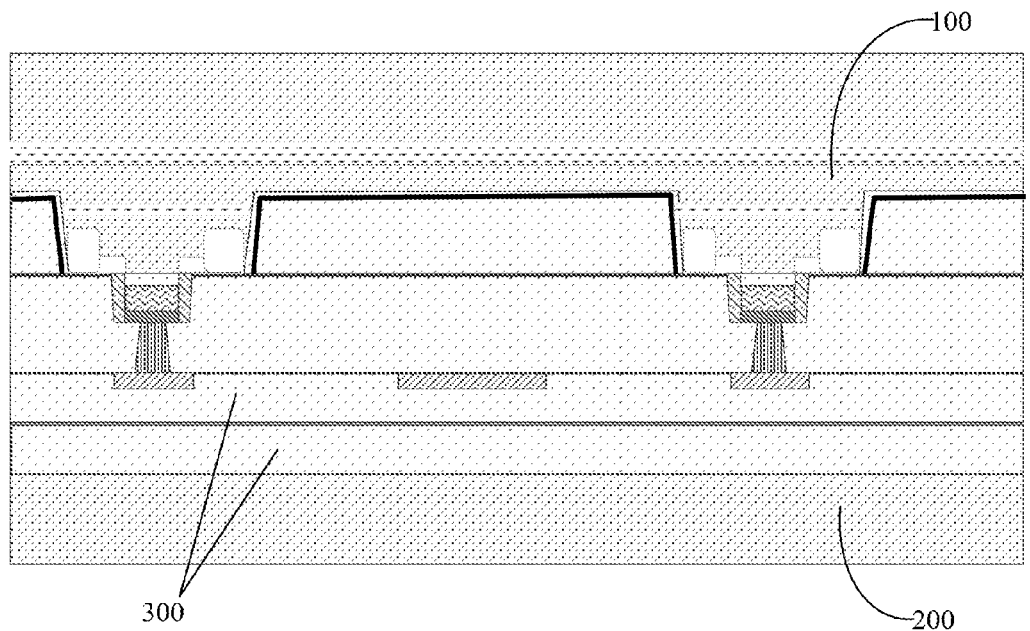

Step A3 includes: providing a carrier substrate 200, and bonding the carrier substrate 200 to the first substrate 100 through the first dielectric cap layer 106, as shown in FIG. 1C.

In an embodiment, step A3 further includes, before bonding the carrier substrate 200 to the first substrate 100, form a bonding cap layer 300 on each of the first dielectric cap layer 106 on the first substrate 100 and the corresponding surface of the carrier substrate 200, as shown in FIG. 1C. In an embodiment, the material for the bonding cap layer 300 may be silicon oxide or other suitable material.

In an embodiment, the first substrate 100 and the carrier substrate 200 may be bonded using fusion bonding or other suitable method.

In an embodiment, the carrier substrate 200 may be a silicon substrate or other suitable substrate. In one embodiment, the carrier substrate 200 and the first substrate 100 have the same shape and size.

The carrier substrate 200 may provide support to the first substrate 100 during the subsequent thinning of the first substrate 100.

Figure 1D:
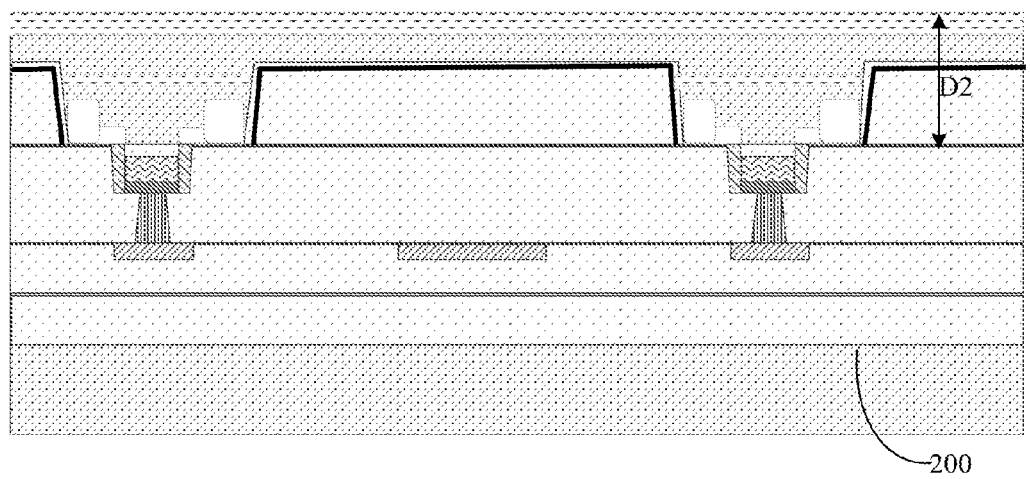

Step A4 includes thinning the first substrate 100 from the second surface 1002. The thinning process includes: performing backside grinding on the first substrate 100 to a sixth depth D6 (not shown), and performing wet etching on the first substrate 100 to a second depth D2, as shown in FIG. 1D. The sixth depth D6 is greater than the second depth D2.

According to embodiments, the backside grinding may include chemical mechanical polishing (CMP) or other suitable processes. The wet etching may use various suitable etching solutions, e.g., TMAH, and the like.

In an embodiment, step A4 may also include, after performing the wet etching, performing low-temperature annealing of the first substrate 100 (including the carrier substrate 200).

Figure 1E:
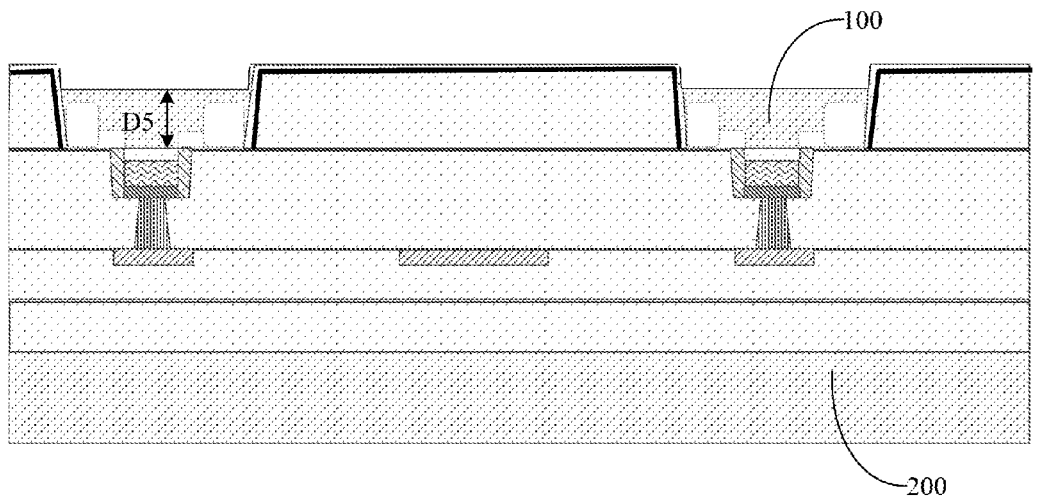

Step A5 includes: performing further thinning of the first substrate 100 from the second surface 1002. The further thinning includes: performing CMP on the first substrate 100 and stopping at the bottom of the shallow trench isolation 103 (for example, the pad layer 1031 may serve as the CMP stop layer). Step A5 further includes, after performing CMP, performing wet etching on the first substrate 100 to the fifth depth D5, as shown in FIG. 1E.

The CMP process may include various suitable CMP processes. The wet etching can use various suitable etching solutions, such as TMAH, and the like.

According to an embodiment, the pad layer 1031 of the shallow trench isolation 103 may serve as the CMP stop layer.

The combination of steps A4 and A5 described above achieves thinning of the first substrate 100 from the second surface 1002 of the first substrate 100.

According to embodiments of the present invention, because the method includes combining the first substrate and carrier substrate and thinning the first substrate, the first substrate may employ conventional bulk silicon substrate as the substrate for the basic device, without using a thin film silicon-on-insulator (TF SOI) substrate, or a high-resistance substrate. As such, manufacturing cost may be reduced.

In addition, by using backside grinding, CMP, wet etching, and other thinning methods (through a plurality of stop layers), the first substrate can be accurately thinned to a desired thickness with a desired uniformity.

Furthermore, since bonding techniques for bonding silicon substrates have become increasingly sophisticated, the method of the present embodiment may ensure the semiconductor device yield, while reducing manufacturing cost.

Figure 1F:
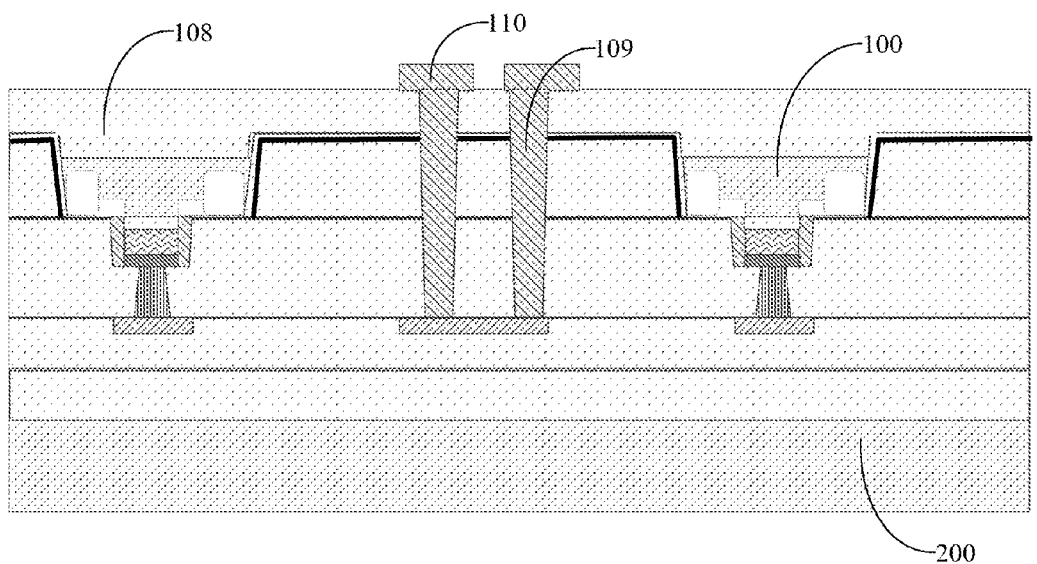

Step A6 includes: forming a second dielectric cap layer 108 on the second surface 1002 of the first substrate 100, and forming at least one through silicon via (TSV) 109. The TSV 109 runs through the second dielectric cap layer 108, the shallow trench isolation 103, the first dielectric cap layer 106, and connects with the first interconnect structure 107 on the surface of the first dielectric layer 106. Step A6 further includes forming a second interconnect structure 110 on the second dielectric cap layer 108, the second interconnect structure 110 being connected to the other end of the TSV 109, as shown in FIG. 1F.

According to an embodiment, forming the TSV 109 includes: performing etching to form a via through the second dielectric cap layer 108, the shallow trench isolation 103, and the first dielectric cap layer 106; filling the via with a conductive material; and removing excess conductive material to form the TSV 109. The conductive material may be a metal or other suitable material. The material for the second interconnect structure 110 may include a conductive metal (such as copper) or other suitable material.

This completes the description of the steps of forming a semiconductor device according to an embodiment of the present invention. Those skilled in the art will appreciate that, in addition to the above-mentioned steps A1 to A6, the method may include additional steps between the steps A1 to A6, or after step A6.

In an embodiment, by bonding the first substrate and the carrier substrate, and subsequently thinning the first substrate, the method utilizes conventional bulk silicon substrate instead of thin film silicon-on-insulator (TF SOI) substrate. Therefore, this method may reduce manufacturing cost.

FIG. 2 shows a simplified flowchart illustrating a method of forming a semiconductor device according to an embodiment of the presented invention.

The method includes, at step S101, providing a first substrate, and from a first surface of the first substrate, forming a shallow trench isolation having a first depth in the first substrate. The first depth is the distance from the bottom of the shallow trench isolation to the first surface of the first substrate.

The method further includes, at step S102, forming at least one transistor on the first surface of the first substrate, forming a first dielectric cap layer covering the first surface of the first substrate, and forming a first interconnect structure on the first dielectric cap layer.

The method further includes, at step S103, providing a carrier substrate, and bonding the carrier substrate to the first substrate through the first dielectric cap layer.

The method further includes, at step S104, thinning the first substrate to a second depth from the second surface of the first substrate opposite to the first surface of the first substrate. The second depth is the distance from the second surface to the first surface of the substrate after the thinning.

The method further includes, at step S105, forming a second dielectric cap layer on the second surface of the first substrate, and forming a through silicon via (TSV). The TSV runs through the second dielectric cap layer, the shallow trench isolation, and the first dielectric cap layer, and connects with the first interconnect structure.

Second Embodiment

In another embodiment of the present invention, an electronic apparatus is provided. The electronic apparatus includes a semiconductor device and an electronic component assembly coupled to the semiconductor device. The semiconductor device includes a semiconductor device formed by the method described above. The electronic component assembly may include any suitable electronic components.

According to an embodiment, the semiconductor device is formed by a method that includes, at step S101, providing a first substrate, and from a first surface of the first substrate, forming a shallow trench isolation having a first depth in the first substrate. The first depth is the distance from the bottom of the shallow trench isolation to the first surface of the first substrate.

The method further includes, at step S102, forming at least one transistor on the first surface of the first substrate, forming a first dielectric cap layer covering the first surface of the first substrate, and forming a first interconnect structure on the first dielectric cap layer.

The method further includes, at step S103, providing a carrier substrate, and bonding the carrier substrate to the first substrate through the first dielectric cap layer.

The method further includes, at step S104, thinning the first substrate to a second depth from the second surface of the first substrate opposite to the first surface of the first substrate. The second depth is the distance from the second surface to the first surface of the substrate after the thinning.

The method further includes, at step S105, forming a second dielectric cap layer on the second surface of the first substrate, and forming a through silicon via (TSV). The TSV runs through the second dielectric cap layer, the shallow trench isolation, and the first dielectric cap layer, and connects with the first interconnect structure.

The electronic apparatus may be a mobile phone, tablet PCs, laptops, netbooks, game consoles, TV receiver, VCD player, DVD player, GPS, camera, video camera, voice recorder, MP3, MP4, PSP players, or any other electronic products or equipment. It can also be an intermediate product having the above semiconductor device, for example: a mobile phone motherboard and the like.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method of forming a semiconductor device, the method comprising:
   providing a first substrate;
   from a first surface of the first substrate, forming a shallow trench isolation in the first substrate, the shallow trench isolation having a pad layer at a first depth, the first depth being a distance from a bottom of the shallow trench isolation to the first surface of the first substrate;
   forming at least one transistor on the first surface of the first substrate, the at least one transistor having a source/drain region at a seven depth, the seventh depth being a distance from the bottom of the source/drain region to the first surface of the first substrate;
   forming a first dielectric cap layer covering the first surface of the first substrate;
   forming a first interconnect structure on the first dielectric cap layer;
   providing a carrier substrate;
   bonding the carrier substrate to the first substrate through the first dielectric cap layer;
   from a second surface of the first substrate opposite to the first surface, thinning the first substrate to the first depth to expose a surface of the pad layer;

after thinning the first substrate from the second surface, removing a portion of the first substrate from the second surface below the at least one transistor to a fifth depth lower than the first depth using a wet etching process, the fifth depth being a distance from the second surface to the first surface of the first substrate after removing the portion of the first substrate from the second surface below the at least one transistor, the fifth depth being greater than the seventh depth;

forming a second dielectric cap layer on the second surface of the first substrate covering the exposed surface of the pad layer of the shallow trench isolation and the portion of the first substrate below the at least one transistor having the fifth depth below the first depth;

forming a through silicon via (TSV), the TSV running through the second dielectric cap layer, the shallow trench isolation, and the first dielectric cap layer, and connected to the first interconnect structure; and forming a second interconnect structure on the second dielectric cap layer connected to the through silicon via.

2. The method of claim 1, wherein thinning the first substrate from the second surface of the first substrate comprises grinding the second surface to a sixth depth, performing a wet etching on the grounded surface to a second depth, the second depth being a distance from the second surface to the first surface of the first substrate after the wet etching, and performing a chemical mechanical polishing on the etched surface using the pad layer as a stop layer, the first substrate comprises a doped epitaxial layer having a third depth, the third depth being a distance from a bottom of the doped epitaxial layer to the first surface of the first substrate, the third depth being greater than or equal to the first depth.

3. The method of claim 1, further comprising, before forming the shallow trench isolation, performing ion implantation from the first surface of the first substrate to form a first injection doped layer having a fourth depth, the fourth depth being a distance from a bottom of the first injection doped layer to the first surface of the first substrate, the fourth depth being greater than or equal to the first depth.

4. The method of claim 1, further comprising: forming an etch stop layer at the fifth depth by performing ion implantation through the first surface of the first substrate, after forming the shallow trench isolation and before forming the at least one transistor.

5. The method of claim 1, wherein thinning the first substrate from the second surface of the first substrate comprises grinding the second surface to a sixth depth, performing a wet etching on the grounded surface to a second depth, the second depth being a distance from the second surface to the first surface of the first substrate after the wet etching, the second depth being greater than the first depth.

6. The method of claim 2, wherein the second depth is substantially same as the third depth.

7. The method of claim 2, wherein the second depth is substantially same as the fourth depth.

8. The method of claim 2, wherein the second depth is substantially same as the fifth depth.

9. The method of claim 1, wherein thinning the first substrate comprises:
performing backside grinding on the second surface of the first substrate; and
performing first wet etching on the second surface of the first substrate to a second depth.

10. The method of claim 9, further comprising, after performing the first wet etching, performing chemical mechanical polishing on the second surface of the first substrate, stopping at the pad layer of the shallow trench isolation.

11. The method of claim 1, wherein the transistor includes a source, a drain, and a gate, and wherein the source and the drain are disposed below the first surface of the first substrate, and the gate is disposed above the first surface of the first substrate.

12. The method of claim 1, wherein the first substrate comprises a bulk silicon substrate.

13. The method of claim 10, further comprising, after performing the first wet etching and before performing the chemical mechanical polishing, performing low-temperature annealing of the first substrate including the carrier substrate.

14. The method of claim 1, wherein the shallow trench isolation further comprises a main structure layer surrounded by the pad layer.

15. The method of claim 14, wherein the pad layer comprises silicon oxide and the main structure layer comprises silicon nitride.

* * * * *